United States Patent [19]
Kim

[11] Patent Number: 6,115,317
[45] Date of Patent: Sep. 5, 2000

[54] SEMICONDUCTOR MEMORY DEVICE FOR MASKING DATA BY CONTROLLING COLUMN SELECT LINE SIGNALS

[75] Inventor: Chul-soo Kim, Suwon, Rep. of Korea

[73] Assignee: Samsung Electronics Co., Ltd., Suwon, Rep. of Korea

[21] Appl. No.: 09/305,362

[22] Filed: May 5, 1999

[30] Foreign Application Priority Data

May 14, 1998 [KR] Rep. of Korea .................. 98-17423

[51] Int. Cl.[7] ................................................ G11C 8/00
[52] U.S. Cl. .............................. 365/230.06; 365/189.05; 365/230.03; 365/230.08
[58] Field of Search ................... 365/230.06, 230.03, 365/230.08, 189.05, 189.08

[56] References Cited

U.S. PATENT DOCUMENTS

| | | | |
|---|---|---|---|
| 4,731,761 | 3/1988 | Kobayashi | 365/230 |
| 5,497,352 | 3/1996 | Magome | 365/230.03 |
| 5,579,280 | 11/1996 | Son et al. | 365/238.5 |
| 5,781,493 | 7/1998 | Kobayashi | 365/230.03 |
| 5,856,952 | 1/1999 | Yoo et al. | 365/230.08 |
| 5,896,342 | 4/1999 | Nakao | 365/230.06 |

*Primary Examiner*—Richard Elms
*Assistant Examiner*—Hien Nguyen
*Attorney, Agent, or Firm*—Howrey Simon Arnold & White, LLP

[57] ABSTRACT

A semiconductor memory device and a column decoder thereof, in which data is masked using column select line signals obtained by the combination of masking signals and a column address to control the column select line signals and reduce the number of data input/output lines and the number of data input/output drivers. The semiconductor memory device includes: a plurality of memory cell arrays including a plurality of memory cells connected between word lines and bit lines; a plurality of switches each having one end connected to that of an adjacent a first memory cell array, and the other end connected to the bit line of a second memory cell array, which turn on in response to column select line signals, with the column select line signals obtained by combination of masking signals, such that data is not written to a column address and the bit line corresponding to the column address; one or more data input/output drivers for bidirectionally driving the data; and data input/output lines for connecting the output of each of the data input/output drivers to the bit lines.

14 Claims, 4 Drawing Sheets

SEMICONDUCTOR MEMORY DEVICE FOR MASKING DATA BY CONTROLLING COLUMN SELECT LINE SIGNALS

BACKGROUND OF THE INVENTION

1. Field of the Invention

The present invention relates to a semiconductor memory device, and more particularly, to a semiconductor memory device that masks data by controlling a column select line signal in order to deactivate a specific column select line signal when one or more columns are selected, and to a column decoder.

2. Description of the Related Art

A semiconductor memory performs a writing operation for storing data input from an outside source and a reading operation for retrieving data stored in the memory cell. When performing writing and reading operations, not all the data are written and read. For example, if there is no need to change the data of a specific memory cell at a specific timing, such a cell is masked out during the writing operation to prevent data from being written over.

In a conventional semiconductor memory device, when k columns are selected out of n columns and m masking signals of k masking signals $M_0 \sim M_{k-1}$ are activated, m data input/output drivers of k data input/output data drivers I/O $DRV_0 \sim I/O\ DRV_{k-1}$ are disabled, so data is simultaneously written to only (k−m) memory cells.

However, in the conventional semiconductor memory devices it is difficult to control the period during which the m data input/output drivers of k data input/output data drivers I/O $DRV_0 \sim I/O\ DRV_{k-1}$ are disabled, and it is difficult to control the timing when the data input/output lines connected to the disabled m data input/output drivers are precharged or equalized to a predetermined voltage level. Also, the conventional semiconductor memory device requires k data input/output lines and k data input/output drivers, which increases the chip size.

SUMMARY OF THE INVENTION

To solve the above identified problems, it is an objective of the present invention to provide a semiconductor memory device that masks data by controlling a column select line signal, in which the device cannot write specific data to specific memory cells by column select line signals obtained by the combination of column addresses and masking signals.

It is another objective of the present invention to provide a column decoder of the semiconductor memory device.

Accordingly, to achieve the above first objective, there is provided a semiconductor memory device that masks data by controlling column select line signals, comprising a plurality of memory cell arrays including a plurality of memory cells connected between word lines and bit lines, a plurality of switches each connected to the bit line of a first memory cell array at one end and to the bit line of an adjacent second memory cell array at the other end, wherein said switches operate in response to the column select line signals obtained by the combination of masking signals and column addresses such that data is not written to the bit line corresponding to the column address, one or more data input/output drivers for bidirectionally driving the data, and data input/output lines for connecting the output of each of the data input/output drivers to the bit lines.

Preferably, if the maximum number of column select line signals to be active simultaneously is k, the number of input/output drivers is equal to or less than k. Here, if a data write command for activating m of the masking signals is given, (k−m) of the column select line signals become active, so that (k−m) switches are turned on, and data in one or more data input/output drivers are simultaneously written to (k−m) memory cells.

To achieve the second objective, there is provided a column decoder of a semiconductor memory device, comprising, (1) k pre-decoders that receives a selection signal for selecting one, or less than k, column select line signals to be simultaneously active; (2) masking signals and lower bits of a column address for decoding; (3) the simultaneous enablement of one, or less than k, pre-decoders; (4) a main decoder for receiving the output signals from the pre-decoders and upper bits of the column address for decoding and outputting a plurality of column select line signals, wherein if the selection signal is in a logic state such that k column select line signals become simultaneously active and m of k masking signals become active, (k−m) of the column select line signals become simultaneously active.

Preferably, if the selection signal activates one of the column select line signals and k masking signals become inactive, one of the pre-decoders is enabled to output an active signal.

The pre-decoders are enabled by an enable clock signal.

Each pre-decoder of the present invention comprises a first logic unit that buffers the masking signals regardless of the lower bits of the column address, a second logic unit that detects the lower bits of the column address, and a third logic unit that selects between signal outputs from the first logic unit and the second logic unit, wherein the main decoder is enabled when a signal output from the third logic unit becomes active.

According to the present invention, the timing for masking data from a specific memory cell is precisely controlled and the number of data input/output lines and drivers is decreased, thereby reducing chip size.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

The present invention now will be described more fully with reference to the accompanying drawings, in which preferred embodiments of the invention are shown.

Figure 1:
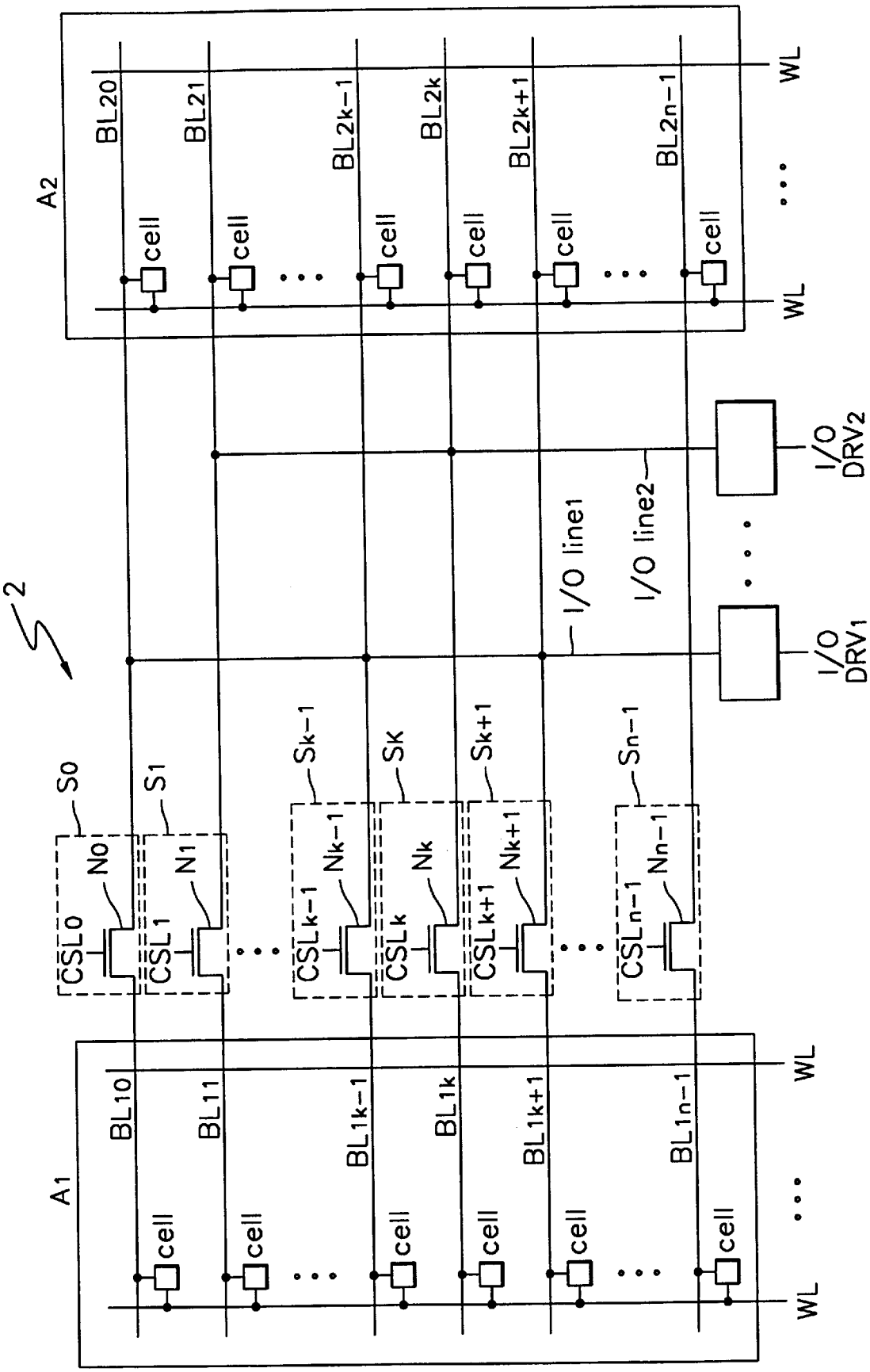
FIG. 1 schematically shows a semiconductor memory device for masking data by controlling a column select line signal according to the present invention.

Referring to FIG. 1, a semiconductor memory device 2 includes a first and a second memory cell arrays $A_1$ and $A_2$, a plurality of switches $S_0$ through $S_{n-1}$, first and second data input/output lines I/O $line_1$ and I/O $line_2$, and first and second data input/output drivers I/O $DRV_1$ and I/O $DRV_2$.

The first and second memory cell arrays $A_1$ and $A_2$ include a plurality of word lines WL, a plurality of bit lines $BL_{10}$ through $BL_{1n-1}$ and $BL_{20}$ through $BL_{2n-1}$, and a plurality of memory cells which are connected to one of word lines WL and each of the bit lines $BL_{10}$ through $BL_{1n-1}$ and $BL_{20}$ through $BL_{2n-1}$.

Switches $S_0$ through $S_{n-1}$ formed of NMOS transistors $N_0$ through $N_{n-1}$, each receives one of column select line signals $CSL_0$ through $CSL_{n-1}$ to select one of the bit lines $BL_{10}$ through $BL_{1n-1}$ and $BL_{20}$ through $BL_{2n-1}$ formed in the first and second memory cell arrays $A_1$ and $A_2$.

Figure 2:
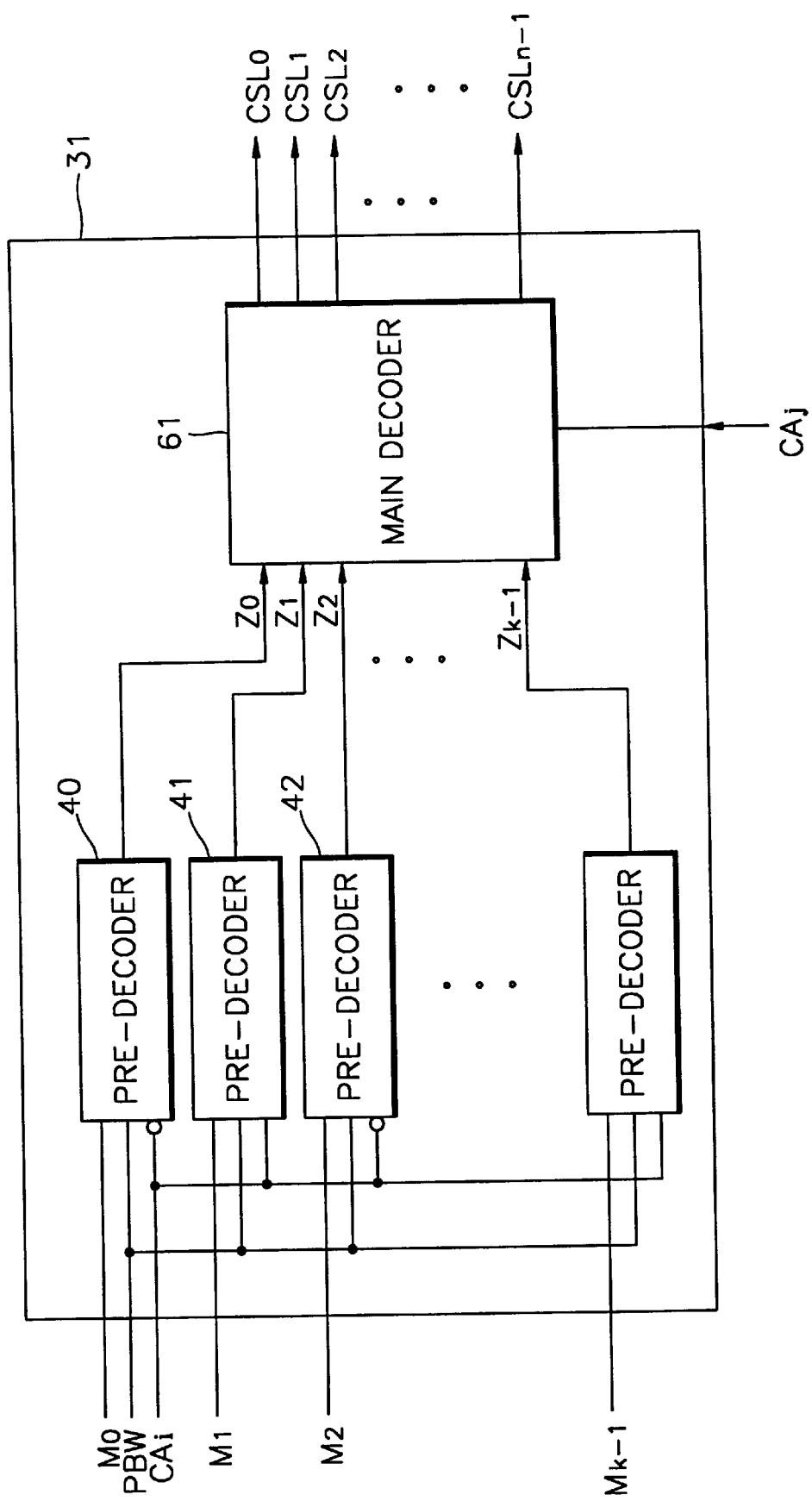
FIG. 2 shows a column decoder for generating a column select line signal of FIG. 1.

The column select line signals $CSL_0$ through $CSL_{n-1}$ are output signals from the column decoder shown in FIG. 2 and connect the bit lines to the data input/output lines I/O line1 and I/O line2, and combine the masking signals that prevent data from being written to the bit lines with a corresponding column address (CA).

Each of the NMOS transistors $N_0$ through $N_{n-1}$ has a gate respectively receiving the column select line signal $CSL_0$ through $CSL_{n-1}$, a source connected to the respective bit line $BL_{10}$ through $BL_{1n-1}$ of the first memory cell array $A_1$, and a drain connected to the respective bit line $BL_{20}$ through $BL_{2n-1}$ of the adjacent second memory cell array $A_2$. In other words, each of the NMOS transistors $N_0$ through $N_{n-1}$ is turned on when the corresponding column select line signal $CSL_0$ through $CSL_{n-1}$ is activated.

Bit line sense amplifiers (not shown) are formed between each of the bit lines $BL_{10}$ through $BL_{1n-1}$ and $BL_{20}$ through $BL_{2n-1}$ and the NMOS transistors $N_0$ through $N_{n-1}$, to sense the data loaded on the bit lines $BL_{10}$ through $BL_{1n-1}$ and $BL_{20}$ through $BL_{2n-1}$ and amplify the sensed data.

The input/output drivers I/O $DRV_1$ and I/O $DRV_2$ drive data and operate bidirectionally, and the input/output lines I/O $line_1$ and I/O $line_2$ connect the bit lines to input/output drivers I/O $DRV_1$ and I/O $DRV_2$ through the switches. Thus, in a read mode, the data loaded on the bit lines connected to the turned-on switches are transferred to the input/output drivers I/O $DRV_1$ and I/O $DRV_2$. Also, in a write mode, the data from the input/output drivers I/O $DRV_1$ and I/O $DRV_2$ are transferred to the bit lines.

When one of the word lines WL in the first memory cell array $A_1$ is activated, a simultaneous writing operation of data to k memory cells in the first memory cell array $A_1$ will be described.

First, when k column select line signals, e.g., 0th through (k–1)th column select line signals $CSL_0$ through $CSL_{k-1}$ are activated to high, the 0th through (k–1)th NMOS transistors $N_0$ through $N_{k-1}$ are turned on, so that the input data of input/output drivers I/O $DRV_1$ and I/O $DRV_2$ are alternately loaded onto the 0th through (k–1)th bit lines $BL_{10}$ through $BL_{1k-1}$ via input/output lines I/O $line_1$ and I/O $line_2$, and are stored in k cells of the first memory cell array $A_1$.

In other words, the input data of the first data input/output drive I/O $DRV_1$ is simultaneously loaded on even-numbered bit lines $BL_{10}, BL_{12}, \ldots, BL_{1k-2}$ of the first memory cell array $A_1$ via the first data input/output line I/O $line_1$, and the input data of the second data input/output driver I/O $DRV_2$ is simultaneously loaded on odd-numbered bit lines $BL_{11}$, $BL_{13}, \ldots, BL_{1k-1}$ of the first memory cell array $A_1$ via the second data input/output line I/O $line_2$.

The data is loaded onto only the 0th through (k–1)th bit lines $BL_{10}$ through $BL_{1k-1}$ of the first memory cell array $A_1$, not the 0th through (k–1)th bit lines $BL_{20}$ through $BL_{2k-1}$ of the second memory cell array $A_2$ because the sense amplifiers connected to the 0th through (k–1)th bit lines $BL_{20}$ through $BL_{2k-1}$ are disabled while the sense amplifiers connected to the bit lines $BL_{10}$ through $BL_{1k-1}$ of the first memory cell array $A_1$ are enabled.

However, if m of the k masking signals included in the 0th through (k–1)th column select line signals $CSL_0$ through $CSL_{k-1}$ become active, only (k–m) column select line signals of the 0th through (k–1)th column select line signals $CSL_0$ through $CSL_{k-1}$ become active. Thus, m of the 0th through (k–1)th NMOS transistors $N_0$ through $N_{k-1}$ are turned off and only (k–m) NMOS transistors are turned on, so that the data input/output drivers I/O $DRV_1$ and I/O $DRV_2$ are simultaneously loaded on (k–m) bit lines of $BL_{10}$ through $BL_{1k-1}$, and, and then simultaneously stored in (k–m) cells of the first memory cell array $A_1$.

This embodiment of the present invention, has two data input/output lines and data input/output drivers respectively. However, the numbers of data input/output lines and drivers may be any numbers equal to or smaller than the maximum number k of column select line signals which become active simultaneously. Also, this embodiment masks data by controlling a column select line signal while writing data. However, the data may also be masked by controlling a data output buffer while reading data.

Thus, a semiconductor memory device according to the present invention combines the masking signal with the column select line signal, and enables the switches $S_0$ through $S_{n-1}$ using the column select line signal combined with the masking signal, which reduces the number of data input/output lines and data input/output drivers less than the maximum number k of column select line signals that are activated simultaneously, thereby decreasing the chip size.

Referring to FIG. 2, a column decoder 31 receives k masking signals $M_0$ through $M_{k-1}$, lower bits ($CA_i$) of the column addresses, and a selection signal PBW to generate one or more column select lines $CSL_0$ through $CSL_{n-1}$. The column decoder 31 includes k pre-decoders 40, 41, 42, . . . , and a main decoder 61.

The selection signal PBW activates one of the column select line signals $CSL_0$ through $CSL_{n-1}$ or simultaneously activates k column select line signals.

Figure 3:
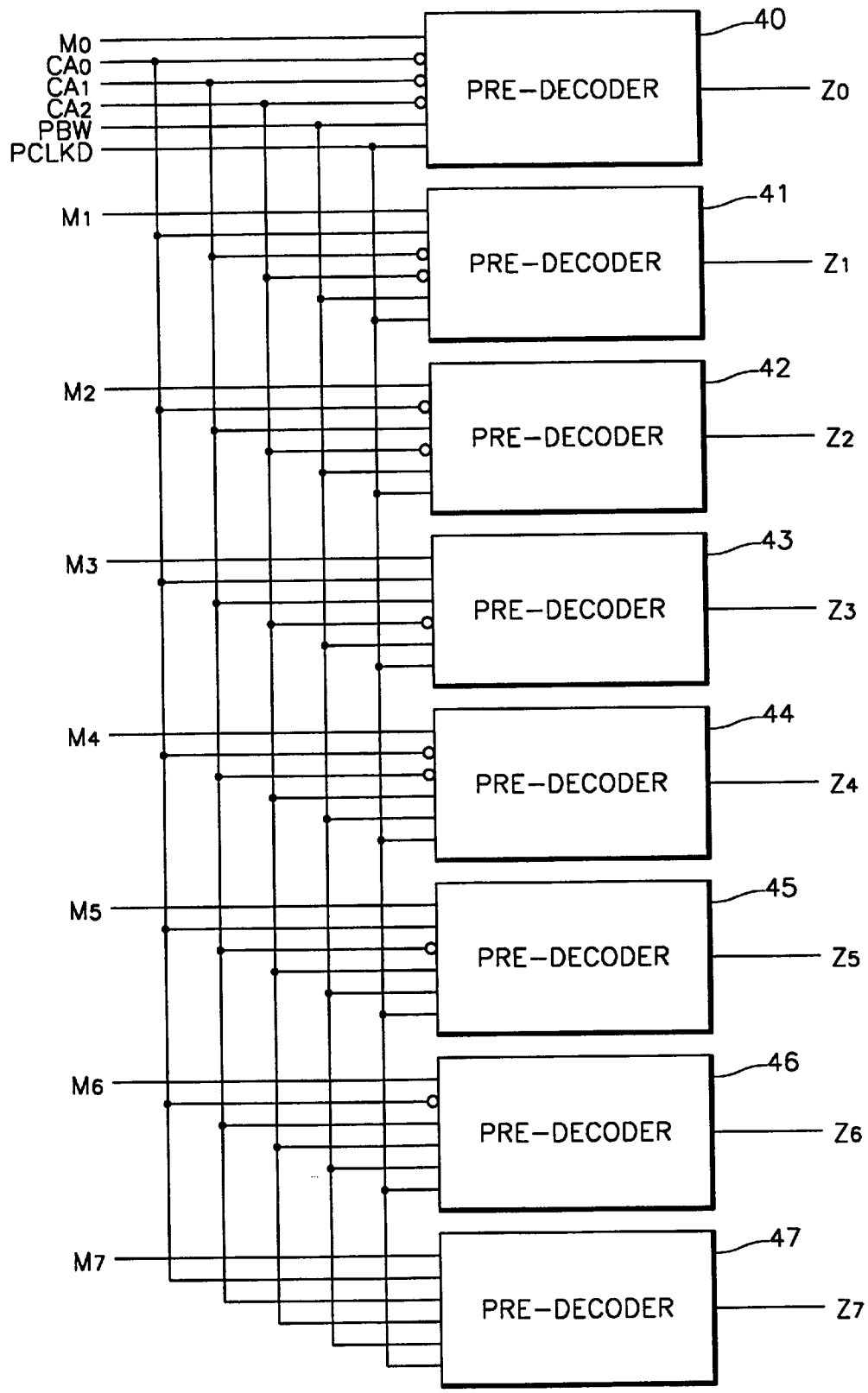
FIG. 3 is a diagram showing 8 pre-decoders formed when the lower bits (CAi) of a column address of the column decoder shown in FIG. 2 are 3 bits, $CA_0$, $CA_1$ and $CA_2$.

The pre-decoders 40, 41, . . . are enabled by an enable clock signal PCLKD (see FIG. 3). Each decoder receives one of masking signals $M_0$ through $M_{k-1}$, the lower bits of the column address and a selection signal PBW. One, or less than k, pre-decoders are simultaneously enabled according to the combination of the selection signal PBW and the masking signals $M_0$ through $M_{k-1}$.

When the numbers of lower bits ($CA_i$) and upper bits of the column address are equal to i and j respectively, the number (k) of pre-decoders 40, 41, . . . or masking signals $M_0$ through $M_{k-1}$ is $2^i$, and the number (n) of column select line signals $CSL_0$ through $CSL_{n-1}$ is equal to $2^{i+j}$. For example, if the number of lower bits ($CA_i$) of the column address is 3, the number (k) of the pre-decoders 40, 41, . . . , or masking signals is 8 (=$2^3$).

The main decoder 61 receives the upper bits ($CA_j$) of the column address and the activated signals among signals $Z_0$, $Z_1, \ldots, Z_{k-1}$, which are outputs from the pre-decoders 40, 41, . . . , to generate k or less than n (=$2^{i+j}$)) column select line signals $CSL_0$ through $CSL_{n-1}$.

Referring to FIG. 3, 8 pre-decoders 40, 41, . . . , 47 are enabled by an enable clock signal PCLKD.

If the selection signal PBW is in a logic state that activities only one of the column select line signals $CSL_0$ through $CSL_{n-1}$, and all of the masking signals $M_0$ through $M_7$ are inactive, only one of the pre-decoders 40, 41, . . . , 47 is enabled to activate one of the signals $Z_0, Z_1, \ldots, Z_7$ respectively from the pre-decoders 40, 41, ..., 47. For example, if the three lower bits $CA_2CA_1CA_0$ are input as 000, it enables only the pre-decoder 40 and only the output signal $Z_0$ of the pre-decoder 40. If $CA_2CA_1CA_0$ are input as 111, it only activates the output signal $Z_7$ of pre-decoder 47.

If the selection signal PBW is in a logic state that simultaneously activates 8 of the column select line signals among $CSL_0$ through $CSL_{n-1}$, and all of the 8 masking signals of $M_0$ through $M_7$ are inactive, all the pre-decoders 40, 41, ..., 47 are enabled to activate the output signals $Z_0$, $Z_1, \ldots, Z_{k-1}$ of the pre-decoders 40, 41, ..., 47. However, even though the selection signal PBW is in a logic state that simultaneously activates 8 of the column select line signals among $CSL_0$ through $CSL_{n-1}$, only (k−m) units of the pre-decoders 40, 41, ..., 47 are enabled if m of the 8 masking signals $M_0$ through $M_7$ are active. As a result, only (k−m) output signals of $Z_0, Z_1, \ldots, Z_{k-1}$ from the pre-decoders 40, 41, ..., 47 are activated.

Figure 4A:
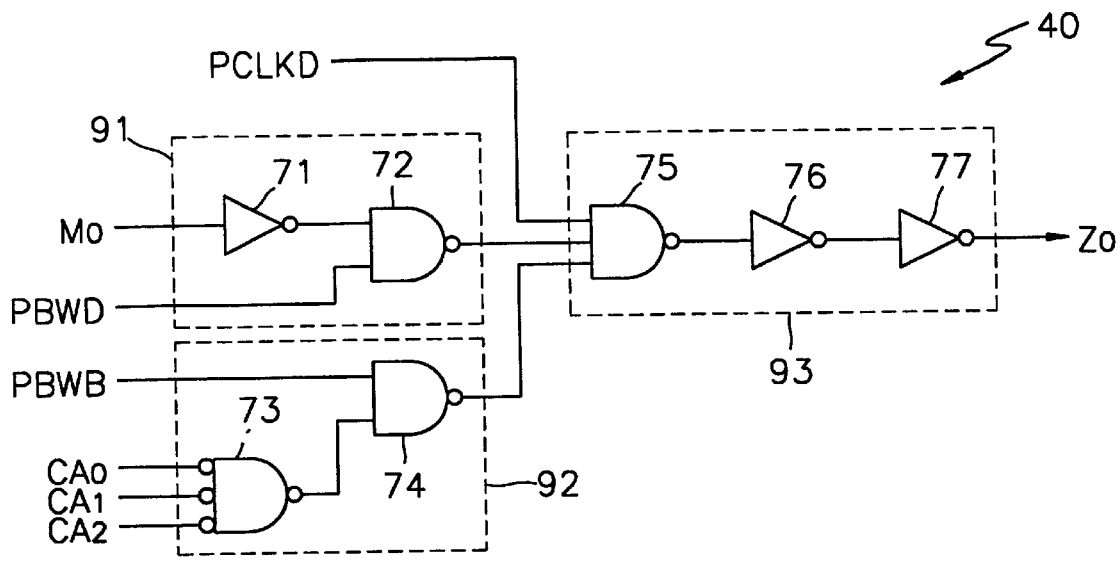
FIGS. 4A and 4B show pre-decoders of FIG. 3.
Figure 4B:
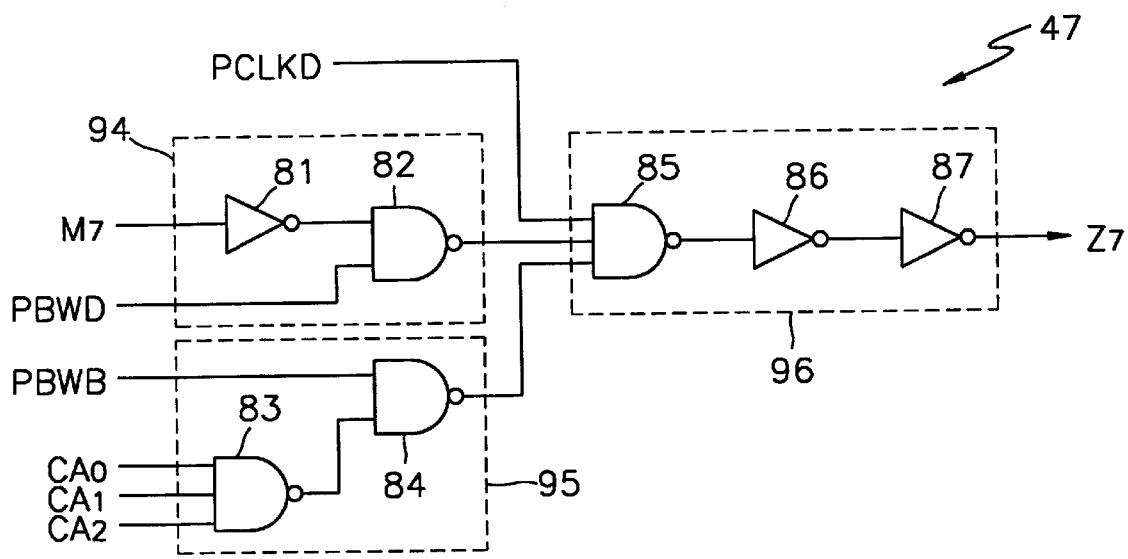

FIG. 4A shows the pre-decoder 40 and FIG. 4B shows the pre-decoder 47.

The pre-decoder 40 includes a first logic unit 91 that buffers the 0th masking signal $M_0$ regardless of the column address, a second logic unit 92 that combines the first, second and third column address bits $CA_0$, $CA_1$ and $CA_2$, and a third logic unit 93 for selecting one of the signals from the first logic unit 91 and the second logic unit 92.

If the main decoder 61 (see FIG. 2) connected to the outputs of the pre-decoders 40 through 47 is a low enable circuit, the low signals of $Z_0$ through $Z_7$ from the pre-decoders 40 through 47 enable the main decoder 61. The first logic unit 91 includes an inverter 71 that inverts the 0th masking signal $M_0$ and a first NAND gate 72 that receives the signal output from the inverter 71 and a first control signal PBWD. The second logic unit 92 includes a second NAND gate 73 that receives column address bits $CA_0$, $CA_1$ and $CA_2$ as all inverted and a third NAND gate 74 that receives the signal from the second NAND gate 73 and a second control signal PBWB. Also, the third logic unit 93 includes a fourth NAND gate 75 that receives the signals from the first and third NAND gates 72 and 74, and the enable clock signal PCLKD, and inverters 76 and 77 for buffering the signal output from the fourth NAND gate 75.

The pre-decoder 47 is the same as the pre-decoder 40, except that a second NAND gate 83 receives column address bits $CA_0$, $CA_1$ and $CA_2$ without inversion. Thus, the second NAND gate 73 of the pre-decoder 40 outputs a logic low signal only when the first, second and third bit $CA_0$, $CA_1$ and $CA_2$ of the column address are all 0, while the second NAND gate 83 of the column decoder 47 outputs a logic low signal when $CA_0$, $CA_1$ and $CA_2$ are all 1.

Also, other pre-decoders 41 through 46 (see FIG. 3) are the same as the pre-decoders 40 and 47, except that each second NAND gate of the pre-decoders 41 through 46 receives one or more of the inversions of the first, second and third bit, $CA_0$, $CA_1$ and $CA_2$ of column addresses.

Figure 5:
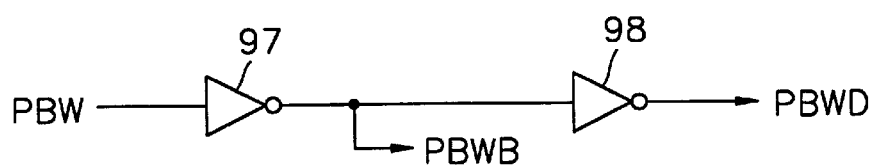
FIG. 5 shows a circuit for generating first and second control signals PBWD and PBWB of FIGS. 4A and 4B.

Referring to FIG. 5, the selection signal PBW is inverted by an inverter 97 to give the second control signal PBWB, and the second control signal PBWB is inverted by an inverter 98 to give the first control signal PBWD.

Referring to FIGS. 4A, 4B and 5, the operation of the pre-decoders will be described.

When the selection signal PBW is logic high, the second control signal PBWB becomes logic low, so the third NAND gates 74 and 84 output a logic high signal all the time regardless of the column address bits $CA_0$, $CA_1$ and $CA_2$. Thus, the signals $Z_0$ and $Z_7$ output from the pre-decoders 40 and 47 are the inversions of the masking signals $M_0$ and $M_7$. For example, if the 0th masking signal $M_0$ is a logic low and the 7th masking signal $M_7$ is a logic high while the selection signal PBW is logic high, the output signal $Z_0$ of the pre-decoder 40 is inactive to logic high and the pre-decoder 47 is active to logic low.

Also, when the selection signal PBW is logic low, the first control signal PBWD is logic low, so the second NAND gates 72 and 82 output a logic high signal regardless of the masking signals $M_0$ and $M_7$. Thus, the signals $Z_0$ and $Z_7$ from the pre-decoders 40 and 47 have the same logic state as the signals output from the second NAND gates 73 and 83, respectively. For example, when the selection signal PBW is a logic low and the column address bits $CA_0$, $CA_1$ and $CA_2$ are 111, the second NAND gate 73 of the pre-decoder 40 outputs a logic high signal, and the second NAND gate 83 of the per-decoder 47 outputs a logic low signal, so that the output signal $Z_0$ of the pre-decoder 40 becomes inactive to logic high, and the output signal $Z_7$ of the pre-decoder 47 becomes active to logic low.

Here, if the upper column address $CA_j$ fed to the main decoder 61 (see FIG. 2) includes 5 bits of $CA_3$ through $CA_7$, the main decoder 61 generates 256 (=$2^8$) column select line signals of $CSL_0$ through $CSL_{n-1}$.

In FIG. 2, if the selection signal PBW is logic high and m of the masking signals $M_0$ through $M_{k-1}$ become active to a logic low, only (k−m) of the signals $Z_0, Z_1, \ldots, Z_7$ become active to logic low. As a result, the semiconductor memory device as shown in FIG. 1 having the column decoder as shown in FIG. 2 turns on (k−m) NMOS transistors of $N_0$ through $N_{n-1}$ when a write command is given, to write data to the (k−m) memory cells.

Also, if the selection signal PBW is logic low, one of k pre-decoders 40, 41, ..., corresponding to the lower bits of the column address, is activated to logic low. Therefore, only one of the n column select line signals $CSL_0$ through $CSL_{n-1}$ output from the main decoder 61 becomes active. As a result, in the semiconductor memory device of FIG. 1, only one of the NMOS transistors $N_0$ through $N_{n-1}$ is turned on when a data write command is given, to write data to only one memory cell.

While the present invention has been illustrated and described with reference to a specific embodiment, further modifications and alterations within the spirit and scope of this invention will occur to those skilled in the art.

What is claimed is:

1. A semiconductor memory device that masks data by controlling column select line signals, said semiconductor memory device comprising:

a plurality of memory cell arrays;

a plurality of switches, each having a first end and a second end, wherein the second end of each switch is connected to a bit line of a second memory cell array adjacent to a first memory cell array;

at least one column decoder receiving a column address as well as a masking signal and outputting at least one column select line signal that activates said plurality of switches;

at least one data input/output driver; and at least one data input/output line connecting said data input/output driver to said plurality of memory cell arrays;

wherein the masking signal prevents writing data at a certain column address and a bit line corresponding to the column address, and wherein said data input/output driver drives data bidirectionally.

2. The semiconductor memory device of claim 1, wherein the number of said data input/output drivers is less than the number of the column select line signals.

3. The semiconductor memory device of claim 1, wherein the column select line signals are simultaneously enabled.

4. The semiconductor memory device of claim 1, wherein said column decoder comprises at least one pre-decoder and at least one main decoder.

5. The semiconductor memory device of claim 4, wherein the pre-decoder receives at least one selection signal for selecting at least one column select line signal.

6. The semiconductor memory device of claim 4, wherein said column decoder operates such that the receipt of at least one selection signal and at least one masking signal determines the number of column select line signals to be output.

7. The semiconductor memory device of claim 4, wherein the pre-decoder is enabled by an enable clock signal.

8. The semiconductor memory device of claim 4, wherein the pre-decoder comprises:

a first logic unit that buffers the masking signal;

a second logic unit that detects certain portion of the column address; and a third logic unit that selects the output from either said first logic unit or said second logic unit.

9. The semiconductor memory device of claim 8, wherein the main decoder is enabled when the output from said third logic unit becomes active.

10. A column decoder for a semiconductor device, comprising:

a plurality of pre-decoders, each of said pre-decoders receiving a selection signal, a masking signal and lower bits of column address; and a main decoder that receives output signals from said pre-decoders and upper bits of column address and outputting a plurality of column select signals, wherein as many column select signals as the number of pre-decoders less than the number of active masking signals are simultaneously activated.

11. The column decoder of claim 10, wherein said pre-decoder comprises:

a first logic unit that buffers the masking signal;

a second logic unit that detects the lower bits of column address; and a third logic unit that selects an output either from said first logic unit or from said second logic unit.

12. The column decoder of claim 10, wherein the number of pre-decoders is two to the power of the number of the lower bits of column address.

13. The column decoder of claim 10, wherein said pre-decoders are activated by an enable clock signal.

14. The column decoder of claim 11, wherein said main decoder is activated when the output from said third logic unit is active.

* * * * *